(12) United States Patent
Milsom et al.

(10) Patent No.: US 7,248,132 B2
(45) Date of Patent: Jul. 24, 2007

(54) FILTER STRUCTURE

(75) Inventors: Robert Frederick Milsom, Redhill (GB); Hans Peter Löbl, Monschau-Imgenbroich (DE)

(73) Assignee: NXP B.V., Eindhoven (NL)

( * ) Notice: Subject to any disclaimer, the term of this patent is extended or adjusted under 35 U.S.C. 154(b) by 108 days.

(21) Appl. No.: 10/514,587

(22) PCT Filed: May 16, 2003

(86) PCT No.: PCT/IB03/01896

§ 371 (c)(1),
(2), (4) Date: Nov. 16, 2004

(87) PCT Pub. No.: WO03/098802

PCT Pub. Date: Nov. 27, 2003

(65) Prior Publication Data
US 2005/0219012 A1    Oct. 6, 2005

(30) Foreign Application Priority Data
May 20, 2002   (EP) .................................. 02253544

(51) Int. Cl.
*H03H 9/00* (2006.01)
*H03H 9/54* (2006.01)
(52) U.S. Cl. ...................................... 333/190; 333/189
(58) Field of Classification Search ................ 333/188, 333/189, 190
See application file for complete search history.

(56) References Cited

U.S. PATENT DOCUMENTS

| | | | |
|---|---|---|---|
| 5,692,279 A | 12/1997 | Mang et al. | 29/25.35 |
| 6,542,055 B1 * | 4/2003 | Frank et al. | 333/189 |
| 6,670,866 B2 * | 12/2003 | Ella et al. | 333/133 |
| 6,870,446 B2 * | 3/2005 | Ohara et al. | 333/188 |
| 6,990,357 B2 * | 1/2006 | Ella et al. | 455/553.1 |

FOREIGN PATENT DOCUMENTS

| | | |
|---|---|---|
| EP | 1017170 | 7/2000 |
| WO | WO 2004/066495 A1 * | 8/2004 |

* cited by examiner

*Primary Examiner*—Dean Takaoka

(57) ABSTRACT

A filter structure, comprising a first signal line, a second signal line, a third signal line and a fourth signal line, said first and third signal lines defining an input port and said second and fourth signal lines defining an output port of a section of said filter structure, said section being defined by a first bulk acoustic wave resonator (A) which is connected between said first signal line and said second signal line, a second bulk acoustic wave resonator (G) which is connected between said third signal line and said fourth signal line, a third bulk acoustic wave resonator (C) which is connected between said first signal line and said fourth signal line, and a fourth bulk acoustic wave resonator (E) which is connected between said second signal line and said third signal line; is characterized in that a frequency pulling factor defined d of at least one of said acoustic wave resonators is non-zero, said frequency pulling factor d being defined by for first and second bulk acoustic wave resonators having a resonant frequency fr1, and for third and fourth bulk acoustic wave resonators having an anti-resonant frequency fa2, f0 being the centre frequency of the filter structure and k the coupling factor of respective resonators.

9 Claims, 10 Drawing Sheets

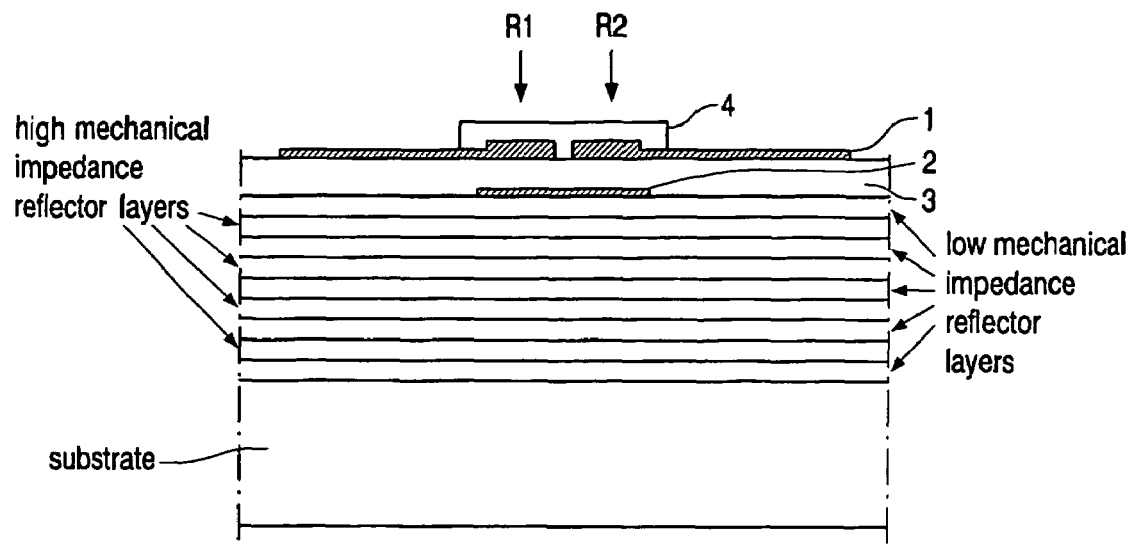
FIG. 7a  side view
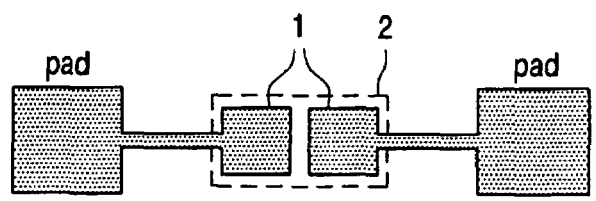
FIG. 7b  top view (excluding mass-loading)

FILTER STRUCTURE

The invention relates to a filter structure, comprising a first signal line, a second signal line, a third signal line and a fourth signal line, said first and third signal lines defining an input port and said second and fourth signal lines defining an output port of a section of said filter structure, said section being defined by a first bulk acoustic wave resonator, which is connected between said first signal line and said second signal line, a second bulk acoustic wave resonator which is connected between said third signal line and said fourth signal line, a third bulk acoustic wave resonator which is connected between said first signal line and said fourth signal line, and a fourth bulk acoustic wave resonator which is connected between said second signal line and said third signal line. At least one further section of first, second, third and fourth acoustic wave resonators is provided, wherein the input port of each said further section is connected with the output port of a preceding section to form a multiple-section filter structure.

Thin-film bulk acoustic wave filters (BAW filters) promise highly miniaturized, potentially integratable, front-end selectivity in wireless communication devices, such as second-generation (2G) and third-generation (3G) handsets. Miniaturization follows from the orders of magnitude smaller wave length of acoustic waves compared to electromagnetic waves at given frequency. The required electromechanical energy conversion in thin-film BAW filters is provided by a piezoelectric layer whose thickness is inversely proportional to the filter center frequency which is typically about 1-2 µm at 2 GHz.

Best piezoelectric films to date, in terms of crystallographic orientation and acoustic loss, have been achieved with aluminum nitride (AlN). The excellent properties of this material translate into important front-end filter characteristics such as low pass-band insertion loss and spurious-mode free stop band. Membrane and Bragg-reflector structures have been investigated as means of confining the acoustic energy to the piezoelectric layer. The invention is applicable to both types of structure.

The principle disadvantage of AlN as a BAW filter material is its relatively low piezoelectric coupling coefficient, a parameter which determines the maximum achievable bandwidth.

Conventionally, filters are configured as so-called ladder filters, wherein a plurality of series resonators is connected between the input and output port of the filter, and are grounded by shunt resonators connected between each pair of series resonators.

A lattice-type filter structure as defined in the introductory is disclosed in EP 1 017 170 A2, based on combinations of series-connected and cross-connected thin-film BAW resonators. The filter structure has very steep attenuation slope outside the pass band. A similar lattice-type structure is described in U.S. Pat. No. 5,692,279 A.

It is the object of the invention to provide a filter structure with further extended bandwidth which can be used in second-generation and third-generation mobile communication systems.

This object is achieved by a filter structure as defined in claim 1. Preferred embodiments are subject-matter of dependent claims, a mobile communication means based on this filter structure is subject-matter of claim 6.

According to the invention, a frequency pulling factor defined δ of at least one of said acoustic wave resonators is non-zero, said frequency pulling factor δ being defined by $$\delta = 2\left(\frac{f_{r1}}{f_0} - 1\right) \cdot \frac{1}{k^2}$$

for first and second bulk acoustic wave resonators having a resonant frequency $f_{r1}$, and $$\delta = 2\left(1 - \frac{f_{a2}}{f_0}\right) \cdot \frac{1}{k^2}$$

for third and fourth bulk acoustic wave resonators having an anti-resonant frequency $f_{a2}$, $f_0$ being the centre frequency of the filter structure and, k the coupling factor of respective resonators. The resonant and anti-resonant frequencies of resonators are indicated by $f_r$ and $f_a$, respectively.

By a combination of lattice architecture and frequency pulling, a wider flat region of the passband is achieved. The addition of extra sections results in a close grouping of additional transmission maxima near the band edges of the lattice design, therefore the presence of more than one section is crucial to achieving at the inventive aim.

In a preferred embodiment, the frequency pulling factor is positive, further preferred equal to or greater than 0.1 and still further preferred equal to or greater than 0.2. It is also preferred to set the frequency pulling factor equal to or smaller than 10.0, and still further preferred equal to or smaller than 1.0.

The disadvantage of frequency pulling is that a dip is created in the center of the passband. Therefore, in a further preferred embodiment, at least one inductor is included in any of said first, second, third and fourth signal lines, whereby a nearly flat passband can be restored.

The invention may be used to implement multiplex filters. The 3G WDCMA system operates in full duplex mode. If both RX and TX paths are connected to a single antenna, a duplexer is required at the front-end and to separate the two signals. Currently, a ceramic duplex filter is seen as the solution. An important difference between duplexers and stand-alone filters is that the two component filters which are connected in parallel at the antenna port, load each other electrically. With a BAW solution based on AlN, both filters appear as different-valued capacitors in each others pass band.

Embodiments of the invention will be described in detail below, by way of example only, with reference to the accompanying drawings, wherein FIG. 1 illustrates a schematic circuit of a two-section lattice filter;

FIGS. 2(a) and (b) show responses of single-section ladder and lattice filters with no frequency pulling and no series inductors, wherein the resonator figure of merit is 10 and 40, respectively;

FIGS. 3(a) and (b) show responses of two-section ladder and lattice filters with no frequency pulling and no series inductors, wherein the resonator figures of merit are 10 and 40, respectively;

FIGS. 4(a) and (b) show responses of two-section ladder and lattice filters with frequency-pulling factor of 0.2 and no series inductors, wherein the resonator figures of merit are 10 and 40, respectively;

FIGS. 5(a) and (b) show responses of two-section ladder and lattice filters with frequency-pulling factor of 0.2 and normalized series inductor reactance of 0.3, wherein the resonator figures of merit are 10 and 40, respectively;

FIGS. 6(a) and (b) show a thin-film BAW resonator implemented as a single resonator with a via and employing a membrane structure to confine the energy;

FIGS. 7(a) and (b) illustrate a thin-film BAW resonator implemented as two identical resonators in series and employing a Bragg-reflector structure to confine the energy;

$f_0$ center frequency of the filter
$f_r$ resonant frequency of a resonator
$f_a$ anti-resonant frequency of a resonator
$\delta$ frequency pulling factor
$k=\sqrt{[(f_a^2/f_r^2)-1]}$ coupling factor of resonators
Q quality factor of resonators
$\eta=Qk^2$ figure of merit of resonators
$\Omega=2(f-f_0)/(f_0 k^2)$ normalized frequency
$\alpha$ ratio of reactance of series tuning inductor to termination resistance at center frequency of filter.

Specifically, resonant and anti-resonant frequencies can be expressed as follows:

$f_{r1}=(1+0.5\delta k^2)f_0$ resonant frequency of series resonators (both filter types)

$f_{a1}=(1+0.5\delta k^2)(1+k^2)f_0$ anti-resonant frequency of series resonators (both filter types)

$f_{r2}=(1-0.5\delta k^2)f_0/(1+k^2)$ resonant frequency of shunt (ladder) or cross resonator (lattice)

$f_{a2}=(1-0.5\delta k^2)f_0$ anti-resonant frequency of shunt (ladder) or cross resonator (lattice).

The static capacitance $C_0$ of each of the two types of resonator in each configuration discussed herein are assumed to be equal, with values providing optimum electrical match to the terminating impedance of the filter.

Figure 1:
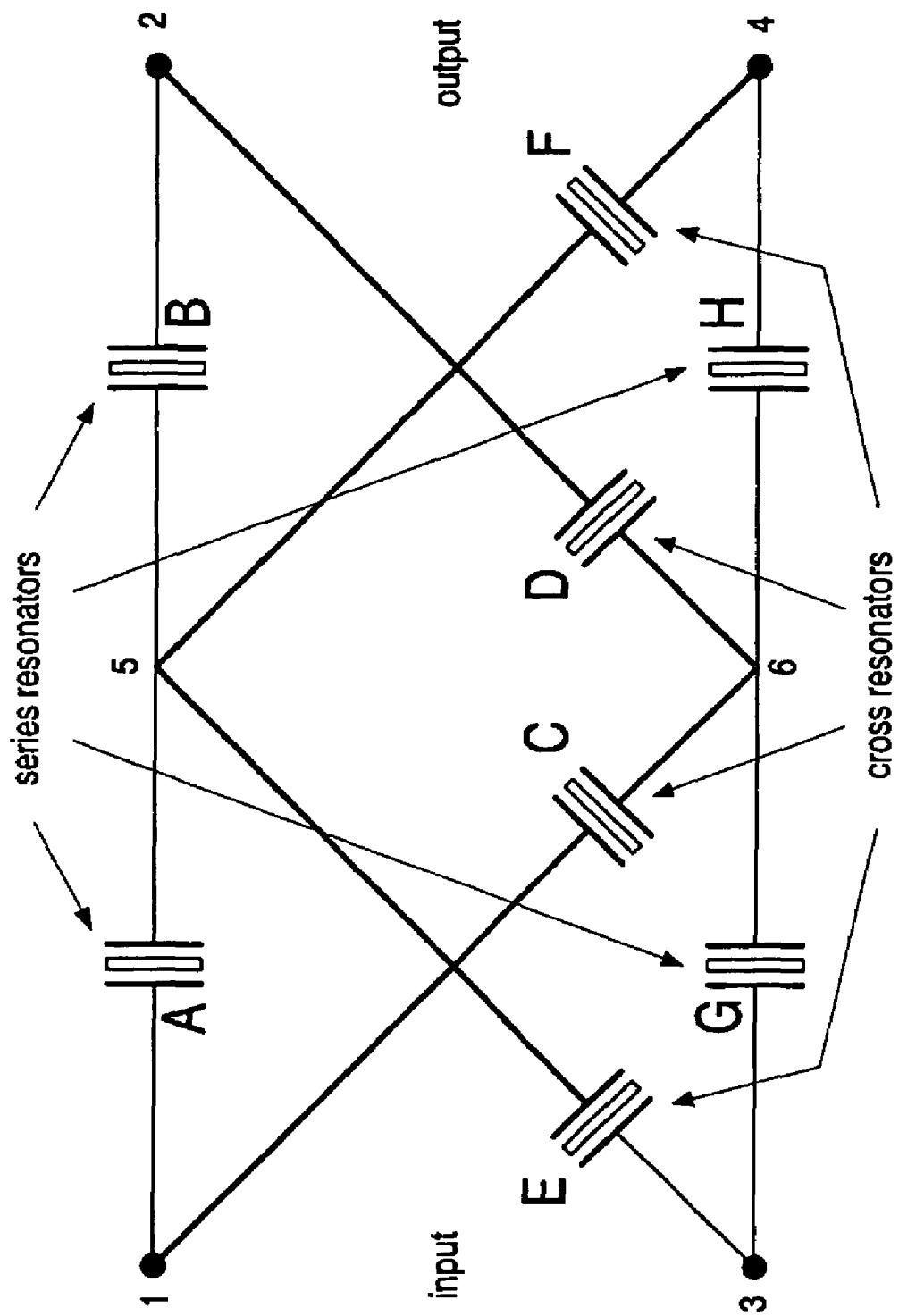

FIG. 1 illustrates a schematic circuit of a two-section lattice filter. An input port of the filter is defined across nodes 1 and 3, an output port across nodes 2 and 4. Each section consists of four thin-film BAW resonators A, C, E, G and B, D, F, H, wherein resonators A, G and B, H are series resonators E, C and D, F are cross resonators. At nodes 5 and 6, both sections are connected with another. Omitted in FIG. 1 are series inductors at the ports.

Figure 2A:
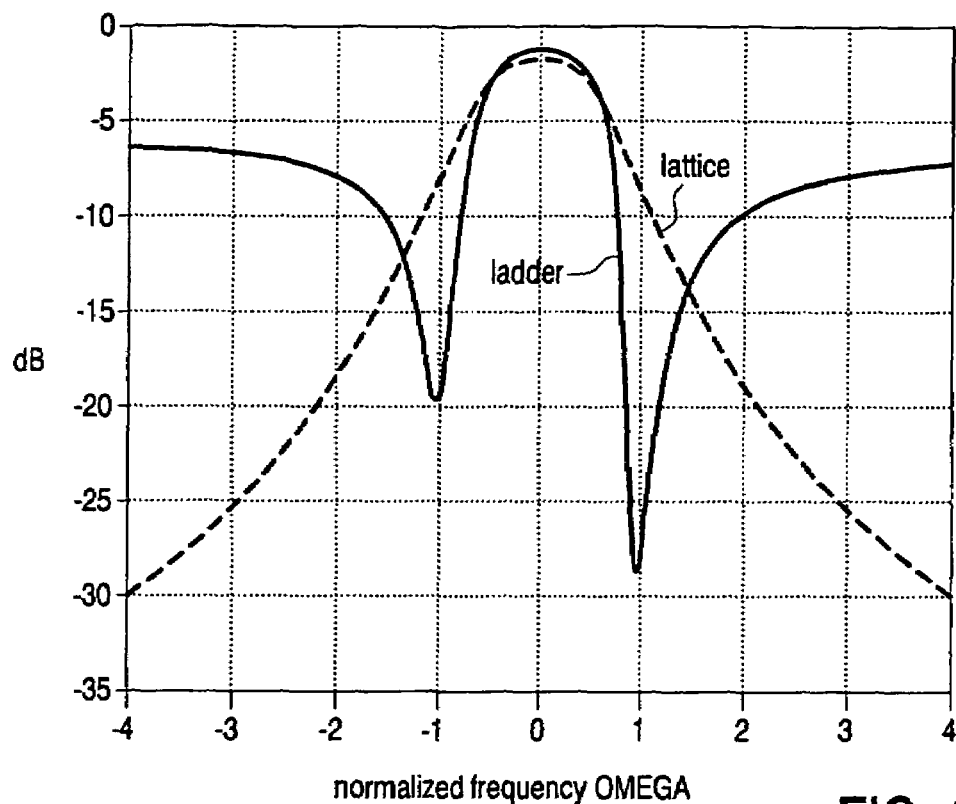
Figure 2B:
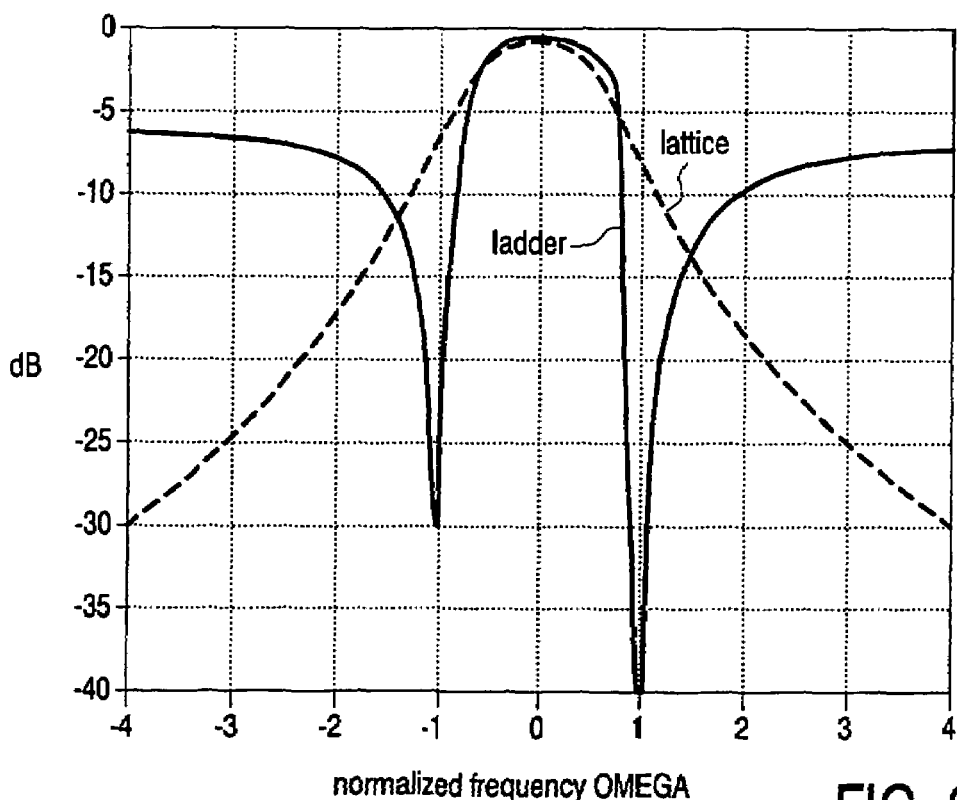

As it is shown in FIGS. 2(a) and (b), a single lattice section comprising two series resonators and two cross resonators does not itself provide more bandwidth than a corresponding T-section of two series and one shunt resonator used in ladder filters. This is true regardless of any frequency pulling. Its main advantage is that its stop band is limited only by parasitics and not by the static capacitance of the resonators themselves. The results, exemplarily shown for the two resonator figures of merit 10 and 40, corresponding to Q~200 and Q~800 with k=0.22 and $\delta=\alpha=0$, confirm that a single lattice section is more symmetrical and provides more out-of-band rejection, but is not wider in its passband than a single ladder-filter T-section.

Figure 3A:
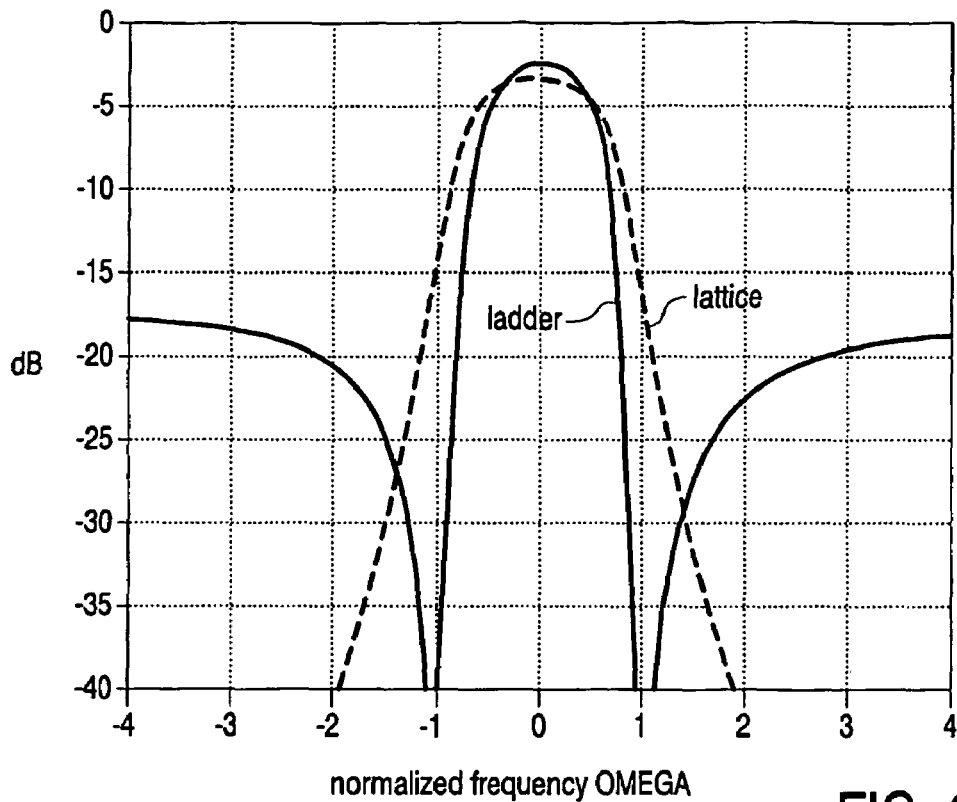
Figure 3B:
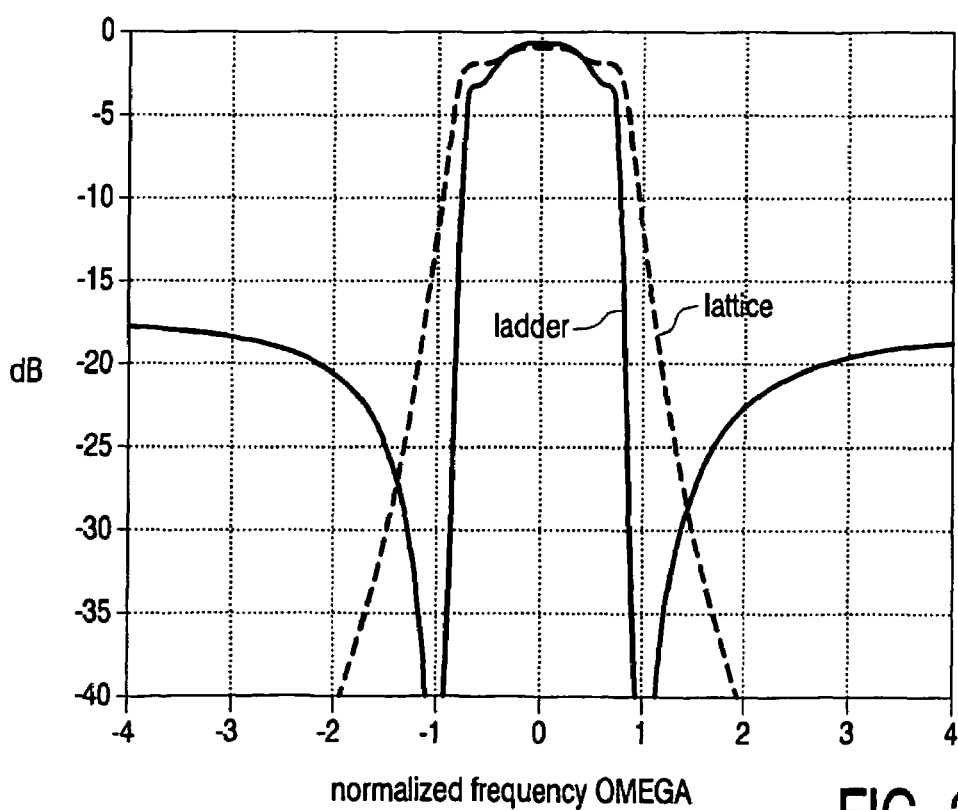

As it is shown in FIGS. 3(a) and 3(b), if a filter comprises more than one section and no frequency pulling is introduced, the lattice filter has wider band width compared to a ladder filter. However, the response of the lattice filter is not very flat. Also the effect of loss on the passband responses of ladder and lattice filters is different.

Figure 4A:
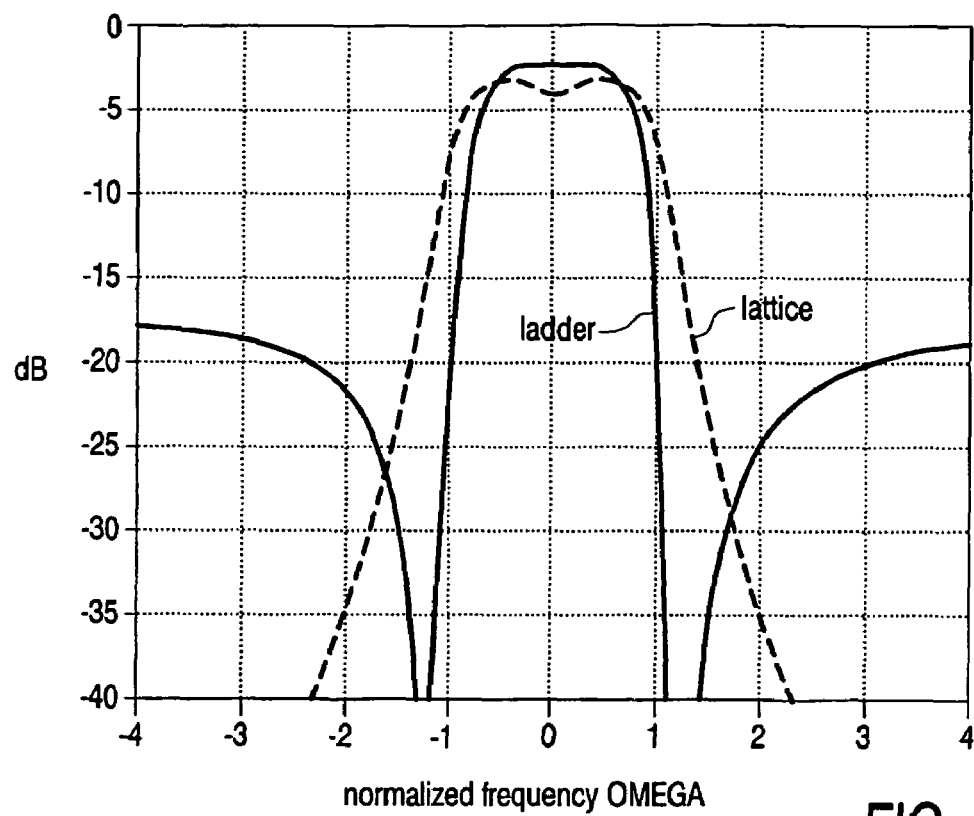
Figure 4B:
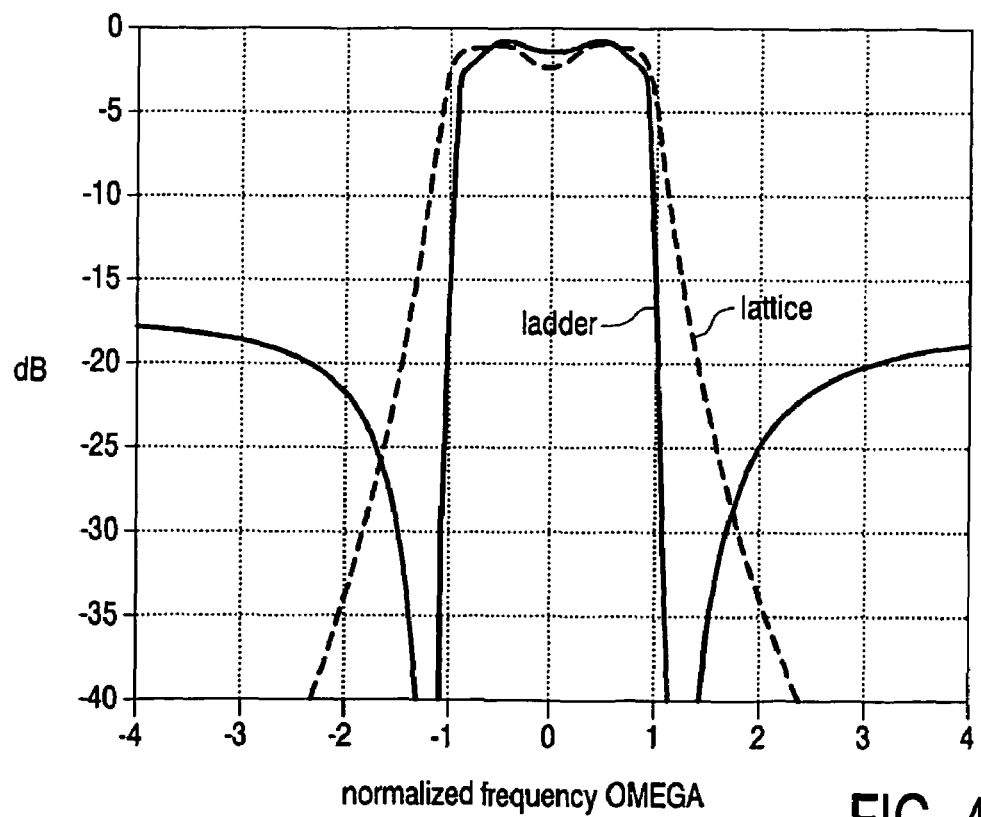

FIGS. 4(a) and (b) show the effect of increasing the separation of series and cross-connected resonator frequencies with $\delta=0.2$, but keeping the normalized series inductor reactance $\alpha=0$, for otherwise identical two-section filters. The response of the lattice filter is now flatter than that of the ladder filter, except that it exhibits a more pronounced dip in the band center. This is the disadvantage of frequency pulling.

Figure 5A:
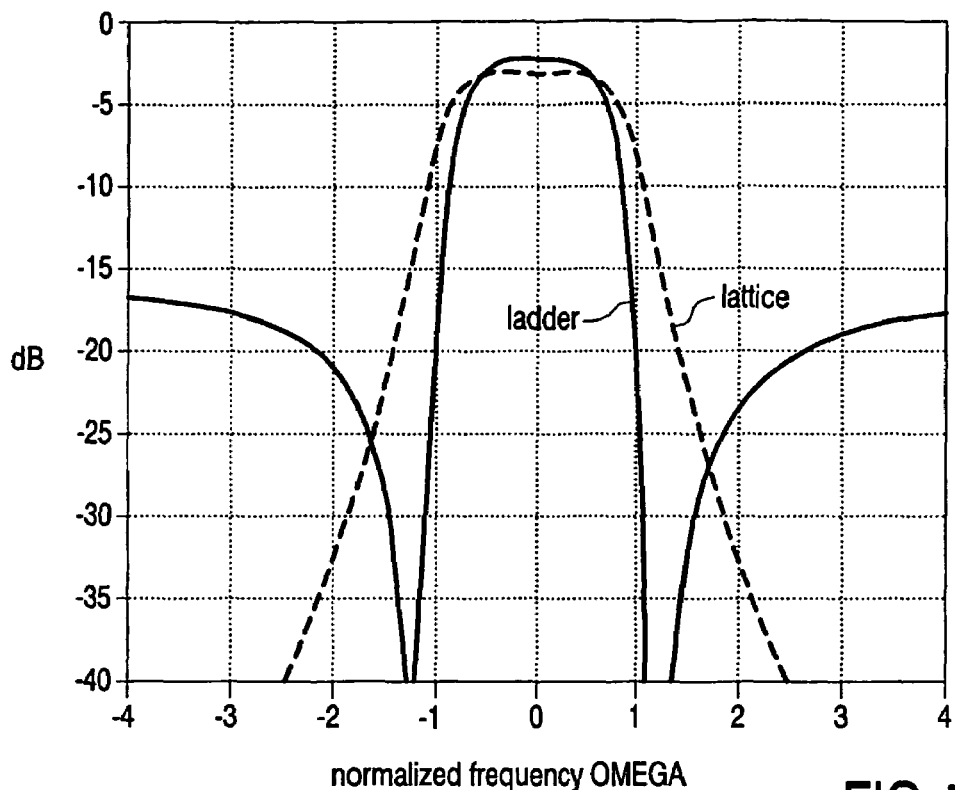
Figure 5B:
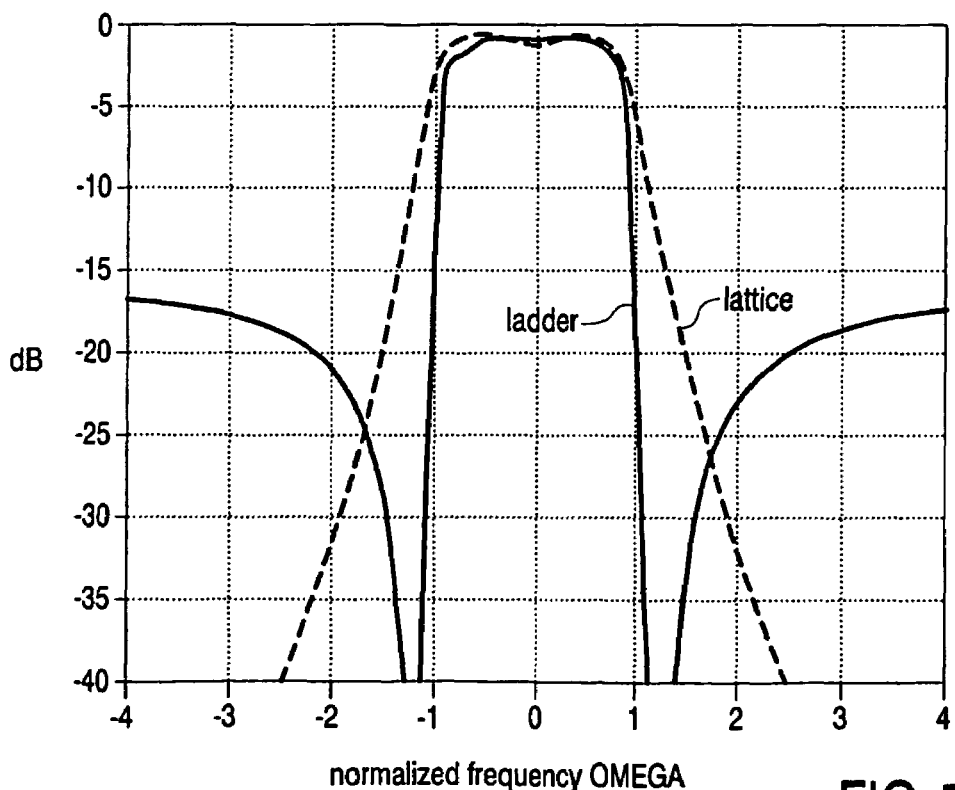

As shown in FIGS. 5(a) and (b), for small dips, of the order of 1 dB, a nearly flat passband can clearly be restored by adding series inductors. The extent to which this is effective dictates the upper limit to bandwidth that can be achieved using the measures proposed. Although large-value high-Q external inductors are highly undesirable, it is found that typically only a small value and a low Q-factor are required for the invention. For example, a 1.5 nH inductor with Q of ~20 may be sufficient. This value of series inductor Q increases insertion loss by only about 0.1 dB compared to an ideal loss-less inductor of the same value. This suggest that typically no more than about 1 mm² of space is likely to be required for each inductor, so these components could be integrated at IC, MCM or PCB level or indeed incorporated as bond-wires. In FIGS. 5(a) and (b) the responses show the ladder filter passband exhibiting substantial "role-off" at the band edges, whereas the lattice filter passband is seen to be enhanced near the band edges giving a nearly flat response, therefore providing substantially more useful bandwidth. The difference in bandwidth and flatness of response between the two architectures is apparent for both values of resonator Q factor. Therefore, although the absolute insertion loss is decreased with increasing resonator Q value, the retention of the flatness of the passband in the presence of loss could in some cases reduce the specification for the resonators. A filter with two lattice sections, also referred to as twin-lattice design, appears to give the flattest pass band response given optimization of other parameters. Also, since the out-of-band rejection provided by a lattice section is intrinsically much greater than that of a ladder T-section, no more than two sections are likely to be needed to meet typical out-of-band specifications.

There are two particular advantages of the twin-lattice design compared to the use of more than two lattice sections. Firstly, since each section adds some loss, the overall insertion loss is lower. Secondly, a layout without vias is feasible, as further described below, whereas this does not appear possible with more than two lattice sections due to the complexity of the interconnections. The wafer processing cost is then kept at the same level as that required for thin-film BAW ladder filters.

Another advantage of lattice filters is that they have electrically-balanced ports, compared to the unbalanced ports of the ladder filter. It is therefore simple to incorporate balun functionality (balanced-to-unbalanced transformation) in a lattice filter, simply by grounding one side of one port. This function is typically required in the receiver (RX) chain of a transceiver between antenna and low-noise amplifier (LNA).

Figure 6A:
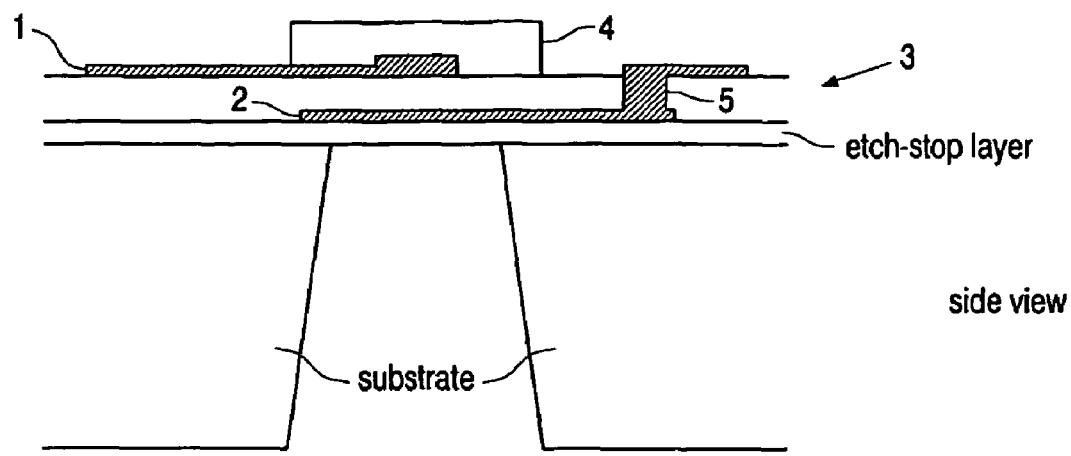
Figure 6B:
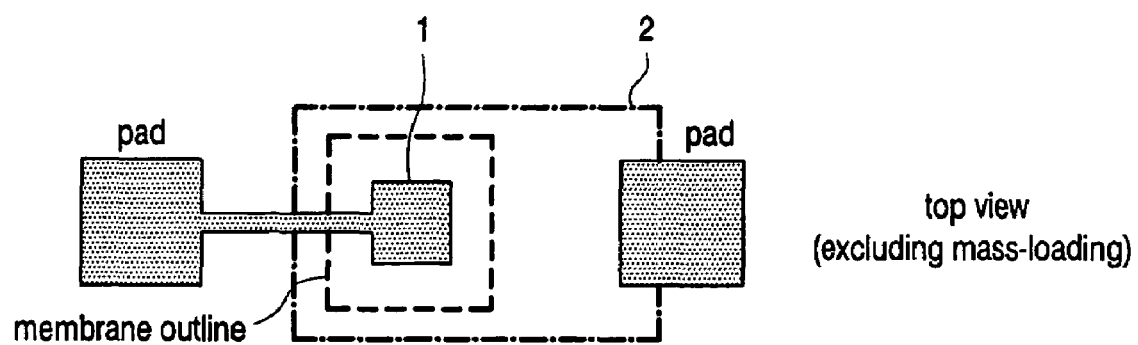

A thin-film BAW filter comprises sets of interconnected resonators formed in a layered structure. FIGS. 6 and 7, respectively, show examples of membrane and Bragg-reflector resonators in a side view (a) and a top view (b). Both employ a piezoelectric layer 3, typically c-axis orientated AlN of the order of 1 µm thick, sandwiched between two metal electrode layers 1, 2 each typically of the order of 0.1 μm thick, to provide the main resonator function. The overlay 4 shown, typically SiO$_2$, is for frequency adjustment, where required, provided by its mechanical loading effect.

FIG. 6 shows a configuration where access to the bottom electrode 2 is provided by a via 5.

FIG. 7 shows an alternative configuration where the resonator is implemented as two identical resonators R1, R2 in series with a floating central electrode 2 in the bottom metallization layer. This arrangement avoids the via, but adds the cost of a fourfold increase in area.

Both types of resonator configuration may be implemented in either the membrane or Bragg-reflector structure. When an electrical signal, at the frequency for which the wave length of the thickness-extensional acoustic mode is approximately twice the piezoelectric layer thickness, is applied between the two electrode layers, this mode which is characterized by alternating extension and compression in the thickness direction is strongly excited. Other orientations of the piezoelectric layer or materials of alternative crystallographic symmetry would give rise to other acoustic modes.

The invention is essentially independent of which of these various approaches to resonator design is taken. However, it is important that there is the option of a via-free layout of a twin-lattice design.

Figure 8:
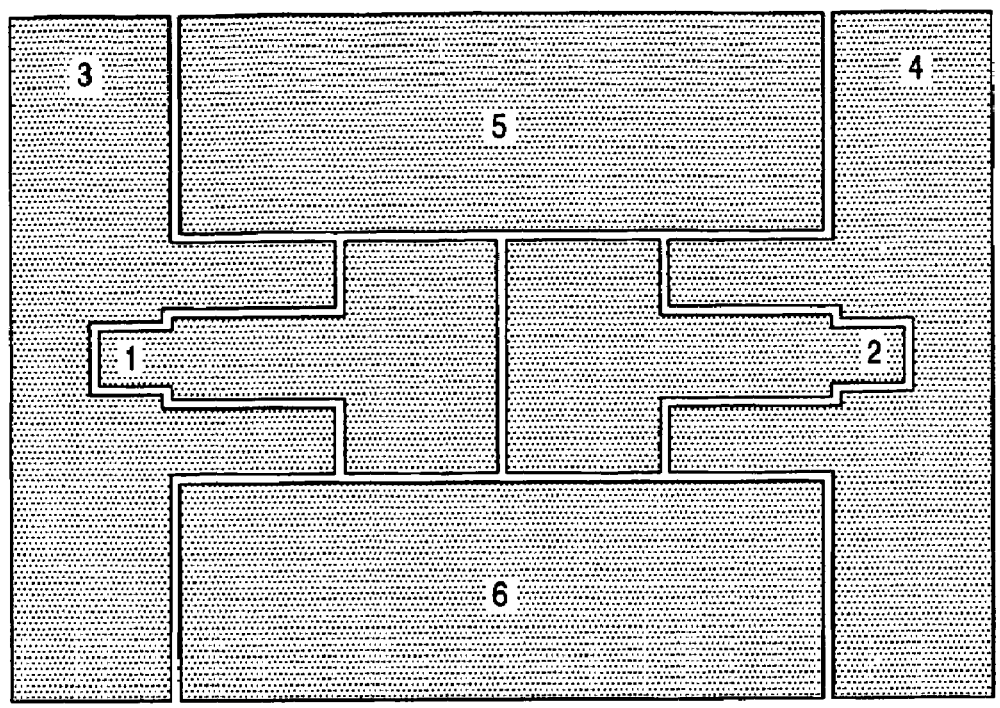
FIG. 8 shows a top metalization layer of twin-lattice filter.
Figure 9:
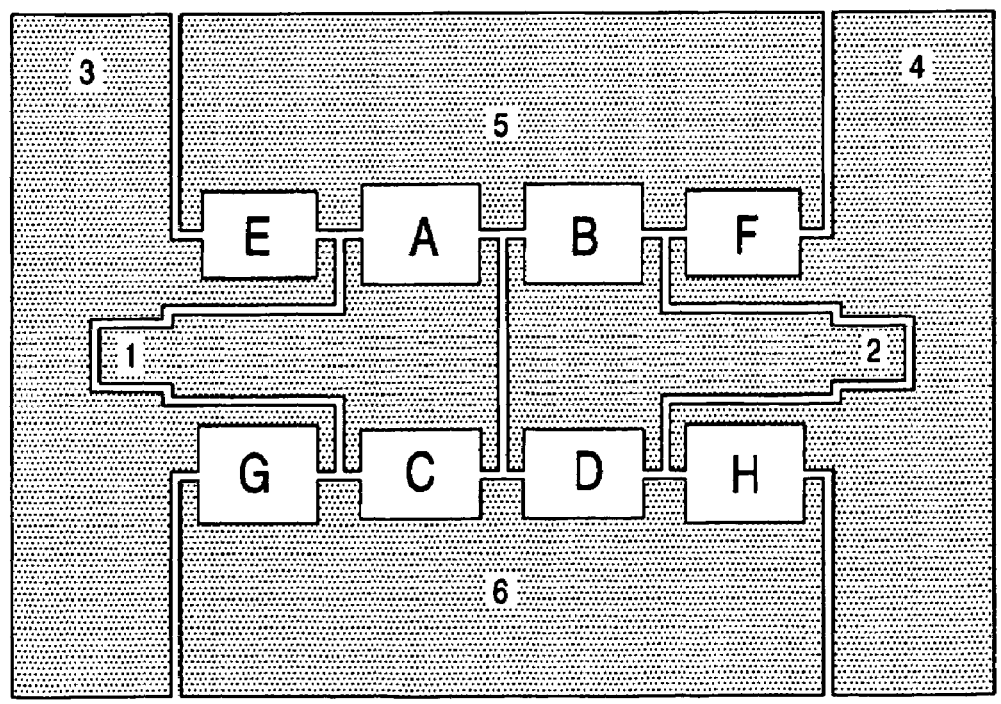
FIG. 9 shows top and bottom metalization layers of twin-lattice filters viewed from below.

FIG. 8 shows the layout of the top metallization layer in one embodiment of a twin lattice filter; FIG. 9 shows both top and bottom metallization patterns from below. The node and resonator labels correspond to those of FIG. 1. The dark area is the top metallization layer, typically aluminum (Al), or molybdenum (Mo), and the bright area is the bottom metallization layer, typically platinum (Pt), or Al, or molybdenum (Mo). Resonators are formed by the overlap of these two areas, each resonator of the schematic being implemented as two physical resonators in series, thus avoiding vias as discussed above.

Figure 10:
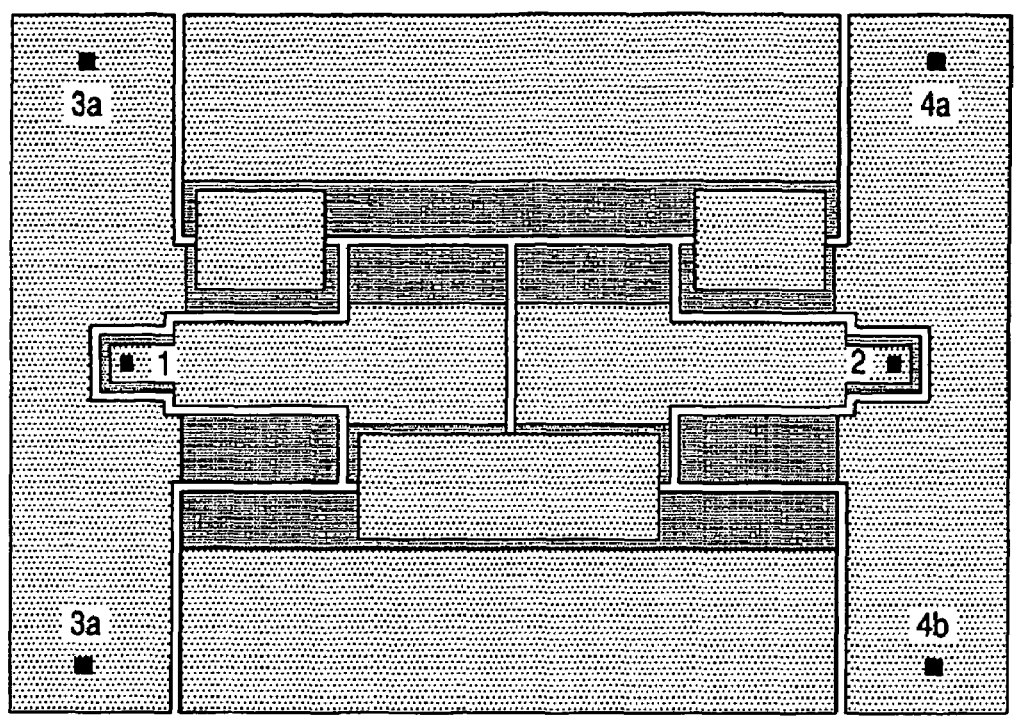
FIG. 10 shows top metalization layer, additional thick metal layer and mass-loading layer of twin-lattice filter with possible connecting points indicated by dots.

FIG. 10 shows the top metallization, again in dark, together with a grey area, which indicates where the mass-loading overlay is deposited to reduce the frequency of the cross-connected resonators, and a dark grey area where the thickness of the top metallization is increased, typically to 5 μm, in order to reduce the resistance of the interconnections. Possible locations of contact points 3a, 3b, 4a, 4b are also shown. The two ports are on the left and right ends of the layout. A contribution to the required series inductance is also provided in this design by the conductors connecting resonators E and G to nodes 3a and 3b, and resonators F and H to nodes 4a and 4b. The overall dimensions of the pattern shown are about 2.5 mm×1.7 mm, the design center frequency is 2.14 GHz.

FIGS. 8 to 10 show that the twin-lattice design can be implemented without using vias in the cross-connection, by unfolding the schematic circuit shown in FIG. 1, so that the crossovers are transferred to the ports. This will still leave one terminal at each port inaccessible within the constraint of a planar structure. However, in practice, the third dimension is likely to be employed at the ports for packaging, either using bond-wires or alternatively solder balls in a flip-chip configuration. The two inaccessible terminals then become accessible. The required small inductors could then be implemented as bond-wires and/or printed connections on the carrier.

Figure 11:
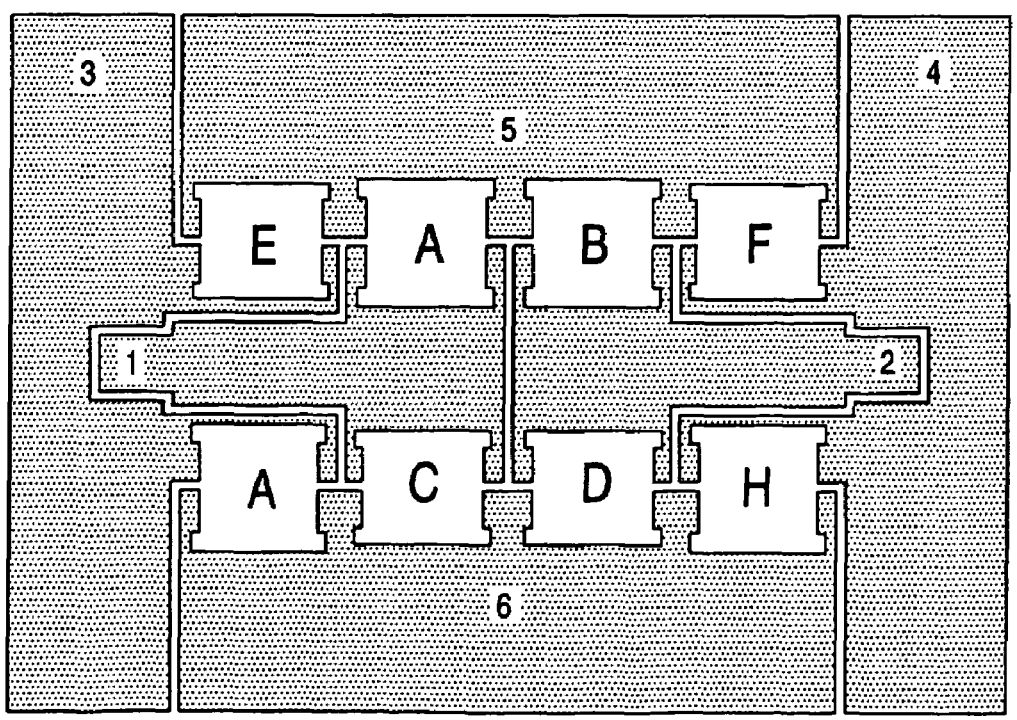
FIG. 11 shows top and bottom metallization layers of twin-lattice filter with holes provided to reduce sensitivity to mask misalignment, as viewed from below.

FIG. 11 shows top (dark) and bottom (bright) metallization patterns for a variant of the above design. This includes rectangular slots in the top metallization in locations corresponding to edges of the bottom electrodes. These have the effect of making the areas of the resonators insensitive to misalignment between the two electrode masks. The use of enclosed slots or holes ensures that the additional resistance introduced into the interconnection paths by this measure is minimal.

Figure 12:
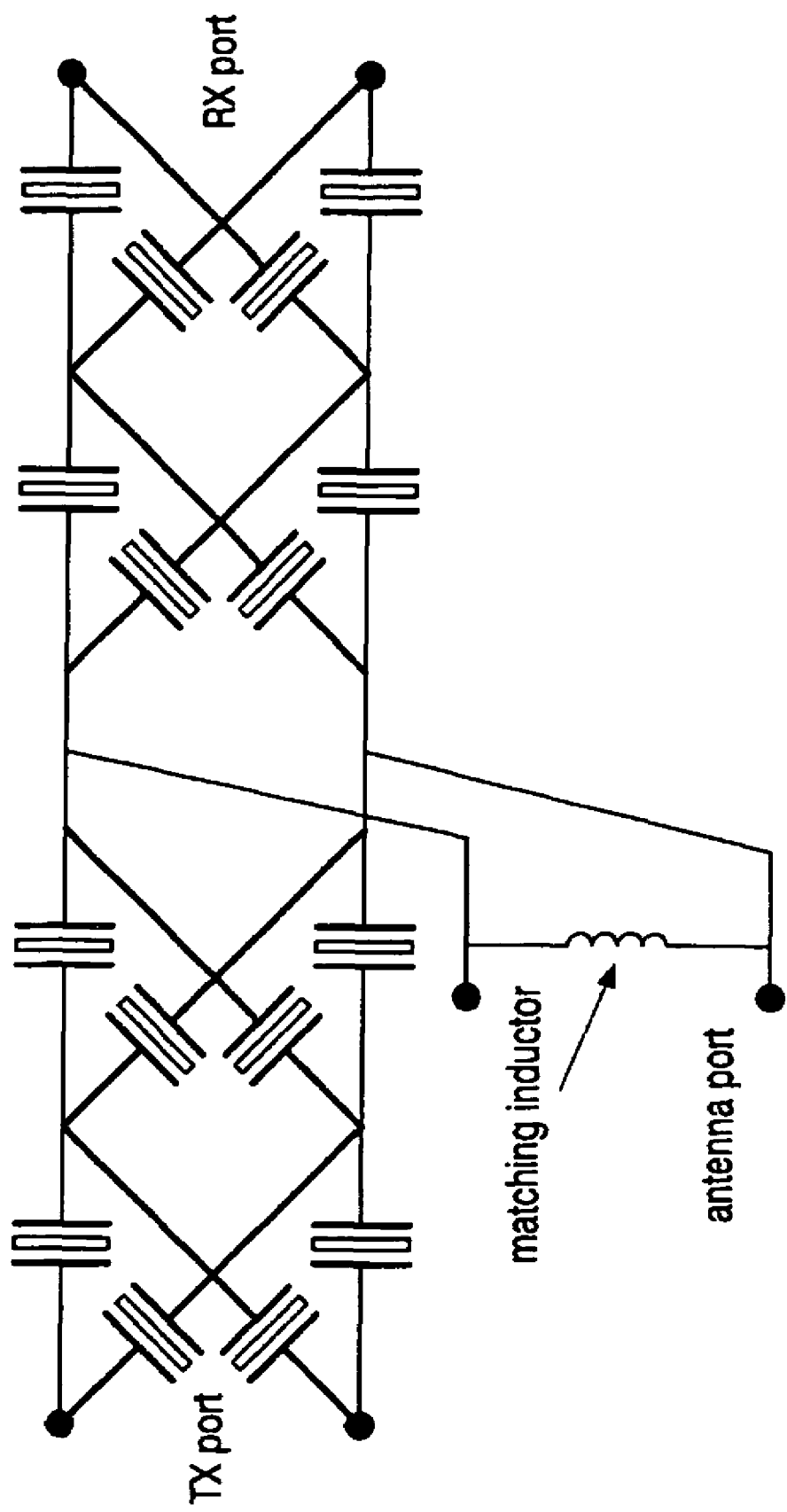
FIG. 12 is a schematic circuit of a duplexer employing twin-lattice RX and TX filters and a single matching inductor at the antenna port. The following abbreviations will be used; partly derived from a narrow-band approximation.

FIG. 12 shows a schematic circuit of a duplexer employing twin-lattice filters on the receiving (RX) and transmitting (TX) sides, and a single matching inductor at the antenna port. The additional bandwidth provided by the invention may allow the filters for the TX and RX paths to employ the same thickness of AlN, the frequency difference being achieved solely by mask-loading the TX filter, e.g. with an additional silicon dioxide (SiO$_2$) overlay. This reduces the bandwidth of the TX filter, but the margin in hand provided by the invention makes this feasible. There would then be a reduction in both complexity and cost of the thin-film processing, since mass-loading is already required to achieve the lower frequencies of the cross-connected resonators, and deposition of amorphous SiO$_2$ is much less critical than deposition of highly-oriented AlN.

An important difference between duplexers and stand-alone filters is that the two component filters which are connected in parallel at the antenna port, load each other electrically. This is compensated by a single parallel matching inductor at the common port, with the series inductors omitted.

The invention claimed is:

1. A method of filtering, comprising a first signal line, a second signal line, a third signal line and a fourth signal line, said first and third signal lines defining an input port and said second and fourth signal lines defining an output port of a section of said filter structure, said section being defined by a first bulk acoustic wave resonator (A) which is connected between said first signal line and said second signal line, a second bulk acoustic wave resonator (G) which is connected between said third signal line and said fourth signal line, a third bulk acoustic wave resonator (C) which is connected between said first signal line and said fourth signal line, and a fourth bulk acoustic wave resonator (F,) which is connected between said second signal line and said third signal line; wherein at least one further section of first, second, third and fourth bulk acoustic wave resonators (B, H, F, D) is provided, wherein the input port of each said further section is connected with the output port of a preceding section to form a multiple-section filter structure, characterized in that a frequency pulling factor defined δ of at least one of said acoustic wave resonators is non-zero, said frequency pulling factor δ defined by $$\delta = 2\left(\frac{f_{r1}}{f_0} - 1\right) \cdot \frac{1}{k^2}$$

for first and second bulk acoustic wave resonators having a resonant frequency fr1, and $$\delta = 2\left(1 - \frac{f_{a2}}{f_0}\right) \cdot \frac{1}{k^2}$$

for third and fourth bulk acoustic wave resonators having an anti-resonant frequency fo2, fo being the center frequency of the filter structure and k the coupling factor of respective resonator.

2. The method of claim 1, characterized in that said frequency pulling factor is positive.

3. The method of claim 1 or 2, characterized in that said frequency pulling factor is equal to or greater than 0.1.

4. The method of claim 1 or 2, characterized in that the frequency pulling factor is equal to or greater than 0.2.

5. The method of claim 1, characterized in that the frequency pulling factor is equal to or smaller than 10.0.

6. The method of claim 1, characterized in that the frequency pulling factor is equal to or smaller than 1.0.

7. The method of any of claims 1 to 2, characterized in that at least one inductor is included in any of said first, second, third and fourth signal lines.

8. A method of filtering for mobile communication, comprising a first signal line, a second signal line, a third signal line and a fourth signal line, said first and third signal lines defining an input port and said second and fourth signal lines defining an output port of a section of said filter structure, said section being defined by a first bulk acoustic wave resonator (A) which is connected between said first signal line and said second signal line, a second bulk acoustic wave resonator (G) which is connected between said third signal line and said fourth signal line, a third bulk acoustic wave resonator (C) which is connected between said first signal line and said fourth signal line, and a fourth bulk acoustic wave resonator (E) which is connected between said second signal line and said third signal line; wherein at least one further section of first, second, third and fourth acoustic wave resonators (B, H, F, D) is provided, wherein the input port of each said further section is connected with the output port of a preceding section to form a multiple-section filter structure characterized in that a frequency pulling factor defined δ of at least one of said acoustic wave resonators is non-zero said frequency pulling factor δ defined by $$\delta = 2\left(\frac{f_{r1}}{f_0} - 1\right) \cdot \frac{1}{k^2}$$

for first and second bulk acoustic wavy resonators having a resonant frequency fr1, and $$\delta = 2\left(1 - \frac{f_{a2}}{f_0}\right) \cdot \frac{1}{k^2}$$

for third and fourth bulk acoustic wave resonators having an anti-resonant frequency fa2, fo being the centre frequency of the filter structure and k the coupling factor of respective resonators.

9. Layout for a filter structure according to the method of claim 1 or 2, characterized in that it is realized essentially in a plane by transferring crossover of connecting lines to input and output ports to unfold the structure.

* * * * *